(12) United States Patent
Wong et al.

(10) Patent No.: US 7,049,858 B2
(45) Date of Patent: May 23, 2006

(54) REDUCING TRANSIENT CURRENT CAUSED BY CAPACITANCE DURING HIGH SPEED SWITCHING

(75) Inventors: Thomas S. Wong, San Jose, CA (US); Benjamin Chan, Fremont, CA (US); Phi Thai, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 42 days.

(21) Appl. No.: 10/666,688

(22) Filed: Sep. 18, 2003

(65) Prior Publication Data

US 2005/0062517 A1 Mar. 24, 2005

(51) Int. Cl.
*H03K 5/22* (2006.01)

(52) U.S. Cl. .......................... 327/65; 327/563

(58) Field of Classification Search ............... 327/65, 327/66, 89, 563; 330/252, 253, 261
See application file for complete search history.

(56) References Cited

U.S. PATENT DOCUMENTS

| | | | | |
|---|---|---|---|---|
| 4,146,844 A | * | 3/1979 | Quinn | 330/149 |
| 4,229,705 A | * | 10/1980 | Takahashi et al. | 330/258 |
| 4,396,883 A | * | 8/1983 | Holloway et al. | 323/313 |
| 4,578,647 A | * | 3/1986 | Sasamura | 330/253 |
| 5,159,211 A | * | 10/1992 | Fujii | 327/58 |
| 5,440,271 A | * | 8/1995 | Laws | 330/252 |
| 5,550,492 A | * | 8/1996 | Murden | 327/65 |
| 5,874,861 A | * | 2/1999 | Nagase et al. | 330/308 |
| 6,300,802 B1 | * | 10/2001 | Smetana | 326/126 |
| 6,404,281 B1 | * | 6/2002 | Kobayashi | 330/85 |
| 6,437,630 B1 | * | 8/2002 | Gilbert | 327/348 |
| 6,618,406 B1 | * | 9/2003 | Kaminishi | 372/38.02 |
| 6,683,896 B1 | * | 1/2004 | Heilman et al. | 372/29.01 |
| 6,876,260 B1 | * | 4/2005 | Visocchi | 330/308 |

* cited by examiner

*Primary Examiner*—Kenneth B. Wells
(74) *Attorney, Agent, or Firm*—Patent Law Group LLP; Brian D. Ogonowsky

(57) ABSTRACT

An isolation resistor is inserted in series between a current source and the emitters of bipolar switching transistors in a differential amplifier. The switching transistors may also be MOSFETs. The in-rush current through the resistor, due to a parasitic or added capacitance, creates a certain increased voltage drop across the resistor, reducing dv/dt and thus reducing the transient in-rush current into the capacitor. This results in reduced waveform distortion. Such an isolation resistor between a current carrying terminal of a switching bipolar transistor and a current source may be used in various applications, including an emitter follower.

4 Claims, 2 Drawing Sheets

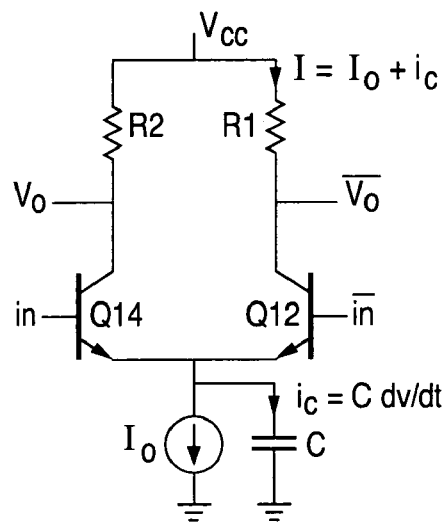
FIG. 1
(PRIOR ART)
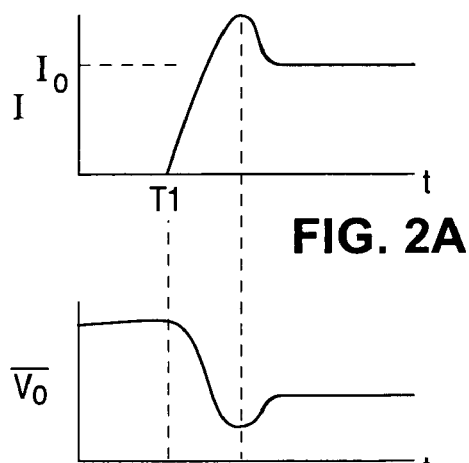
FIG. 2A
FIG. 2B
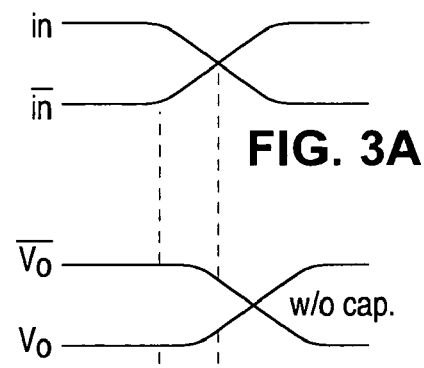
FIG. 3A
FIG. 3B
FIG. 3C
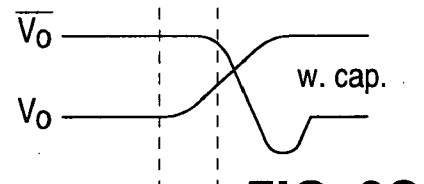
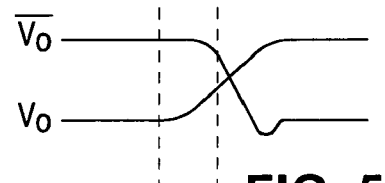
FIG. 5

REDUCING TRANSIENT CURRENT CAUSED BY CAPACITANCE DURING HIGH SPEED SWITCHING

FIELD OF INVENTION

This invention relates to switching circuits and, in particular, to increasing the speed of a switching circuit incorporating one or more transistors.

BACKGROUND

FIG. 1 illustrates a conventional differential amplifier including transistors Q12 and Q14 and a current source $I_o$. Differential inputs applied to the transistors cause the output voltages $V_o$ and $\overline{V_o}$ to assume high and low states. It is desirable for the differential amplifier to have a fast switching speed and large bandwidth.

A capacitor C is shown coupled to the emitters of the transistors. This capacitor may be parasitic, caused by line capacitance, collector-base capacitance of $I_o$, base-emitter capacitance of Q12 and Q14, or may be a capacitance intentionally added to the circuit to increase switching speed as described below.

FIG. 2A illustrates the current flowing through resistor R1 when the switching signal into transistor Q12 goes high at time T1. The transient in-rush current is due to the current flowing into the capacitor C in accordance with the equation $$i = C\frac{dv}{dt}.$$

FIG. 2B illustrates the corresponding output voltage during the switching time.

FIG. 3A illustrates the voltage levels of the differential input signals in and $\overline{in}$.

FIG. 3B illustrates the output voltages in response to the switching signals of FIG. 3A without any capacitor C coupled to the emitters or in an ideal environment. Note the switching delay of the output voltages with respect to the input signals. This is due to the switching delays of the transistors.

FIG. 3C illustrates the output voltages when the capacitor C is coupled to the emitters of the transistors. Note that the output voltage, when going high, has a faster response time as compared to the output voltage when going low. When the output voltage goes from low to high, meaning that its associated transistor is turning off due to the switching signal, the fixed current source $I_o$ draws some current from the capacitor C, causing less current to flow through the transistors. This reduction in current through the resistors R1 and R2 causes the output voltage to rise more quickly. When the output voltage goes low (such as shown in FIG. 2B), a transient in-rush current through the associated resistor and switching transistor charges capacitor C and initially distorts the output voltage signal until a steady state condition occurs. This distortion is undesirable in applications such as amplifiers where the signal quality is important. The distortion of the falling output signal gets worse when the switching speed of the circuit is increased.

What is needed is an improvement to a switching circuit where increasing switching speed does not result in significant distortion of the output signal.

SUMMARY

An isolation resistor is inserted in series between a current source and the emitters of the switching transistors in a differential amplifier. The in-rush current through the resistor, due to a parasitic or added capacitance, creates a certain increased voltage drop across the resistor, reducing dv/dt across the capacitor and thus reducing the transient in-rush current into the capacitor. This results in reduced waveform distortion.

Such an isolation resistor for any transistor (e.g., bipolar or MOSFET) and current source may be used in various applications.

In another embodiment, an isolation resistor is coupled between two emitters in a differential pair of bipolar switching transistors to isolate the effects of each transistor's base/emitter capacitance during switching by reducing the transient current flowing from one switching transistor to the other switching transistor. Each transistor is coupled to its own current source, with a separate isolation resistor in series between the current source and the emitter of the switching transistor.

The result is a faster switching circuit with less distortion than the prior art circuits.

BRIEF DESCRIPTION OF THE DRAWINGS

FIG. 1 illustrates a prior art differential pair of bipolar transistors with an added or parasitic capacitor coupled to the emitters of the transistors.

FIGS. 2A and 2B are the current and output voltage waveforms, respectively, of the switching circuit of FIG. 1.

FIG. 3A is a waveform of the differential input signals applied to the circuit of FIG. 1.

FIG. 3B is a waveform of the differential output voltages without any capacitor in the circuit of FIG. 1.

FIG. 3C is a waveform of the differential output voltages where the capacitor C is included in the circuit of FIG. 1.

FIG. 5 is a waveform of the differential output voltages of the circuit of FIG. 4, showing increased switching speed and less distortion as compared to the waveform of FIG. 3C.

DETAILED DESCRIPTION

Figure 4:
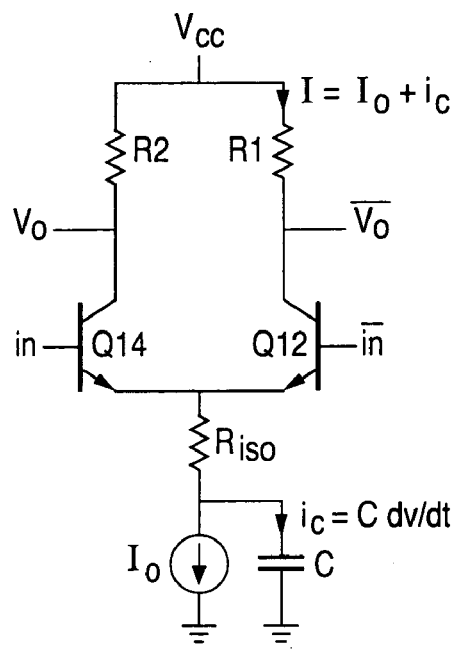
FIG. 4 illustrates one embodiment of the present invention, with an isolation resistor formed between the emitters of the differential pair and the current source.

FIG. 4 is a schematic diagram of a differential amplifier switching circuit identical to that of FIG. 1 except with an isolation resistor $R_{iso}$ in series between the common emitters of the transistors and the current source $I_o$. The isolation resistor is not a parasitic resistance of the conductor but is an intentional resistance of a desired value preferably optimized to reduce the distortion in the output voltage to an acceptable level without an unacceptable voltage drop across the resistor. Such a resistor may be formed by a diffused region, by a thin film, or by any other technique.

When either of the transistors Q12 or Q14 turn on, there will be an in-rush current into the capacitor C that is determined by $$C * \frac{dv}{dt}.$$

The voltage drop across the isolation resistor during this transient current reduces the dv/dt across the capacitor by an amount proportional to $i_e R_{iso}$. Accordingly, the voltage drop across $R_{iso}$ will depend on the speed of switching. Therefore, the effect of $R_{iso}$ is particular beneficial at high switching speeds.

FIG. 5 is a waveform of the differential output voltage signals, showing approximately the same increased switching speed as the prior art circuit of FIG. 1 when the output voltage goes from low to high, due to the effects of the capacitor C, but with much less distortion in the output signal when the output signal goes from high to low.

The value of $R_{iso}$ in one embodiment is typically selected to be in the range of $$\frac{100 \text{ mV}}{I_0} < R_{iso} < \frac{200 \text{ mV}}{I_0}.$$

In one embodiment, the capacitor value is the parasitic capacitance, whose value is dependent on the circuit layout and process parameters. There is no relationship between the isolation resistor and the capacitance seen at the emitter. The total capacitance seen at the emitter is the metal line capacitance, base-emitter capacitance, and the capacitance at the collector of the current source transistor.

Figure 6:
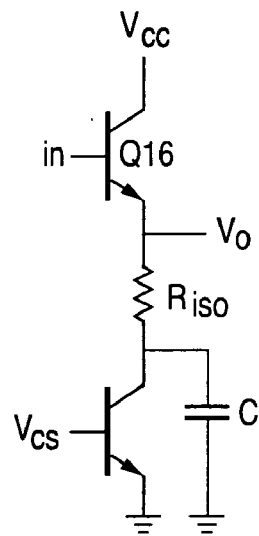
FIG. 6 is a schematic diagram of an emitter follower circuit using the isolation resistor to reduce distortion in the output signal.

FIG. 6 is a schematic diagram of an emitter follower circuit with transistor Q16, current source $I_o$, and isolation resistor $R_{iso}$ in series between the emitter of Q16 and the current source. The isolation resistor $R_{iso}$ reduces the dv/dt and thus decreases the in-rush current into the capacitor and ringing at the output. This reduces the output signal distortion and could significantly improve the speed.

To offset a quiescent voltage drop across the isolation resistor in the various embodiments, operating voltages and/or component values in the circuit, such as resistor values and $I_o$, may need to be adjusted as necessary.

Figure 7:
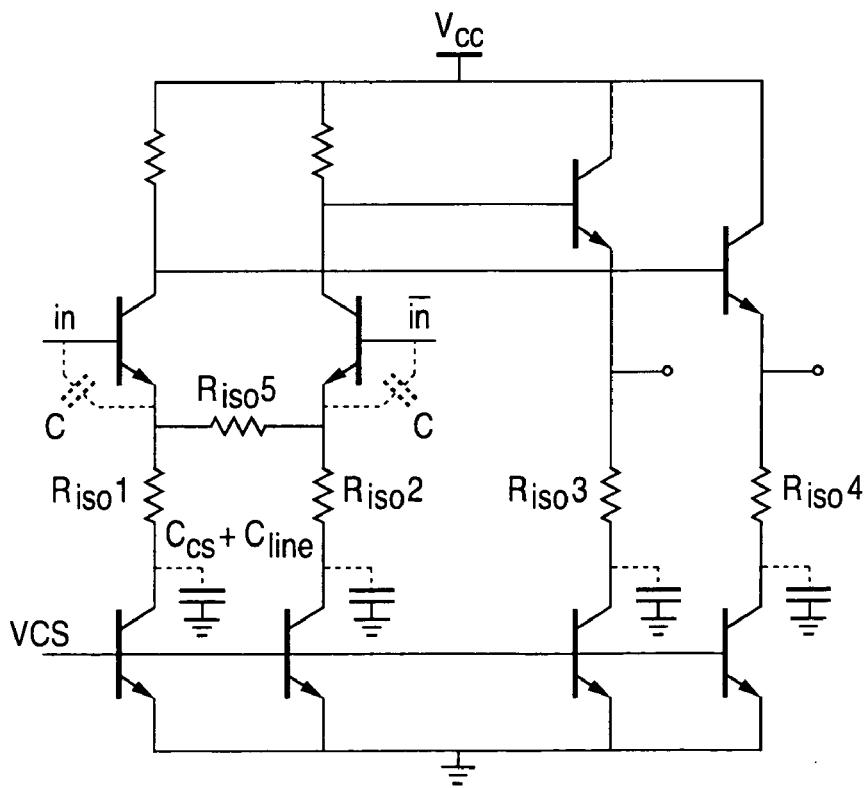
FIG. 7 illustrates the use of the isolation resistor in a differential pair, in conjunction with emitter followers, where the isolation resistor is coupled between the emitters of the switching transistors.

FIG. 7 illustrates a differential amplifier with its outputs coupled to emitter followers. Isolation resistors $R_{iso}1$, $R_{iso}2$, $R_{iso}3$, and $R_{iso}4$ are shown, which function as described above with respect to FIGS. 4 and 6. Additionally, an isolation resistor $R_{iso}5$ is inserted between the emitters of the differential pair to isolate the effects of each transistor's base-emitter capacitance during switching by reducing the transient current flowing from one switching transistor to the other switching transistor. The circuit designer determines the value for $R_{iso}5$ based on the requirements of the differential amplifier because $R_{iso}5$ affects the gain of the differential amplifier. $R_{iso}5$ will set the gain of the differential amplifier and will assist the reduction of the transient current flowing from one switching transistor to the other switching transistor. Since the emitters are isolated, each transistor of the differential pair has its own current source.

The isolation resistor should be located in close proximity to the switching transistors in order to have the greatest effect on reducing waveform distortion caused by the capacitive transient currents.

The isolation resistor may be applied to other forms of differential pairs including those using MOSFETs instead of bipolar transistors. Depending upon the configuration, the MOSFETs may be NMOS types or PMOS types. Additionally, depending upon the configuration, the NPN bipolar transistors may be PNP bipolar transistors, with the emitters connected to a voltage supply through a current source and the isolation resistor.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiment illustrated and described.

What is claimed is:

1. A switching circuit comprising:
   a first switching transistor having a control terminal coupled to a first input signal and having a first current carrying terminal;
   a first current source, providing a fixed current, coupled to the first current carrying terminal;
   a first isolation resistor connected in series between the first current carrying terminal and the current source, the isolation resistor reducing an in-rush current into a capacitance between the first isolation resistor and the current source to reduce distortion in an output signal of the circuit when the first switching transistor is switched,
   wherein the first switching transistor forms part of a differential pair of switching transistors, the circuit further comprising:
   a second switching transistor with a control terminal coupled to a second input signal and having a second current carrying terminal coupled to the first current carrying terminal of the first switching transistor, wherein the first switching transistor and the second switching transistor are bipolar transistors, and the first and second current carrying terminals are emitters of the first and second switching transistors;
   a second isolation resistor coupled in series directly between the first current carrying terminal of the first switching transistor and the second current carrying terminal of the second switching transistor;
   a second current source, providing a fixed current; and
   a third isolation resistor in series between the second current carrying terminal and the second current source.

2. The circuit of claim 1 wherein the first switching transistor comprises an NPN bipolar transistor.

3. A method of operation of a switching circuit, the switching circuit comprising a first switching transistor having a control terminal coupled to a first input signal and having a first current carrying terminal; a first current source, providing a fixed current, coupled to the first current carrying terminal; and a first isolation resistor connected in series between the first current carrying terminal and the current source, the method comprising:
   conducting a current through the isolation resistor during switching of the switching transistor to reduce an in-rush current into a capacitance between the first isolation resistor and the current source to reduce distortion in an output signal of the circuit when the first switching transistor is switched,
   wherein the first switching transistor forms part of a differential pair of switching transistors, the circuit further comprising a second switching transistor with a control terminal coupled to a second input signal and having a second current carrying terminal coupled to the first current carrying terminal of the first switching transistor, wherein the first switching transistor and the second switching transistor are bipolar transistors, and the first and second current carrying terminals are emitters of the first and second switching transistors;

a second isolation resistor coupled in series directly between the first current carrying terminal of the first switching transistor and the second current carrying terminal of the second switching transistor, wherein the first switching transistor and the second switching transistor arc bipolar transistors, and wherein the circuit farther comprises a second current source, providing a fixed current, and a third isolation resistor in series between the second current carrying terminal and the second current source, the method further comprising:

at least partially isolating effects of parasitic capacitances of the first switching transistor and the second switching transistor during switching by reducing transient current through the second isolation resistor flowing between the first switching transistor and second switching transistor; and conducting a current through the third isolation resistor during switching of the second switching transistor to reduce an in-rush current into a capacitance between the third isolation resistor and the second current source to reduce distortion in an output signal of the circuit when tbe second switching transistor is switched.

4. The method of claim 3 wherein the first switching transistor comprises an NPN bipolar transistor.

* * * * *